United States Patent
Bruce et al.

(10) Patent No.: US 9,054,160 B2
(45) Date of Patent: Jun. 9, 2015

(54) INTERCONNECT STRUCTURE AND METHOD FOR FABRICATING ON-CHIP INTERCONNECT STRUCTURES BY IMAGE REVERSAL

(75) Inventors: Robert L. Bruce, White Plains, NY (US); Qinghuang Lin, Yorktown Heights, NY (US); Alshakim Nelson, San Carlos, CA (US); Satyanarayana V. Nitta, Poughquag, NY (US); Dirk Pfeiffer, Croton on Hudson, NY (US); Jitendra S. Rathore, Campbelle, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 382 days.

(21) Appl. No.: 13/088,054

(22) Filed: Apr. 15, 2011

(65) Prior Publication Data
US 2012/0261828 A1 Oct. 18, 2012

(51) Int. Cl.
*H01L 21/4763* (2006.01)
*H01L 21/768* (2006.01)
*H01L 23/522* (2006.01)
*H01L 23/532* (2006.01)

(52) U.S. Cl.
CPC ...... *H01L 21/76832* (2013.01); *H01L 23/5222* (2013.01); *H01L 23/5329* (2013.01); *H01L 23/53295* (2013.01); *H01L 21/76801* (2013.01); *H01L 21/76804* (2013.01); *H01L 21/76808* (2013.01); *H01L 21/7682* (2013.01); *H01L 21/76825* (2013.01); *H01L 21/76826* (2013.01); *H01L 21/76828* (2013.01); *H01L 21/76835* (2013.01); *H01L 2221/1031* (2013.01)

(58) Field of Classification Search
CPC .................... H01L 21/76801; H01L 21/76808
USPC ................................... 438/638, 674
See application file for complete search history.

(56) References Cited

U.S. PATENT DOCUMENTS

| | | |
|---|---|---|
| 4,808,545 A | 2/1989 | Balasubramanyam et al. |
| 5,461,003 A | 10/1995 | Havemann et al. |
| 5,651,857 A | 7/1997 | Cronin et al. |
| 5,795,830 A | 8/1998 | Cronin et al. |
| 5,976,768 A | 11/1999 | Brown et al. |
| 5,981,148 A | 11/1999 | Brown et al. |

(Continued)

FOREIGN PATENT DOCUMENTS

KR 100809901 B1 3/2008

OTHER PUBLICATIONS

Final Office Action for U.S. Appl. No. 13/088,083 mailed on Mar. 19, 2014.

(Continued)

*Primary Examiner* — Samuel Gebremariam
(74) *Attorney, Agent, or Firm* — Tutunjian & Bitetto, P.C.; Louis J. Percello

(57) ABSTRACT

An interconnect structure includes a patterned and cured dielectric layer located directly on a surface of a patterned permanent antireflective coating. The patterned and cured dielectric layer and the permanent antireflective coating form shaped openings. The shaped openings include an inverse profile which narrows towards a top of the shaped openings. A conductive structure fills the shaped openings wherein the patterned and cured dielectric layer and the permanent antireflective coating each have a conductively filled region.

18 Claims, 7 Drawing Sheets

(56) References Cited

U.S. PATENT DOCUMENTS

| | | | |
|---|---|---|---|
| 6,007,968 | A | 12/1999 | Furukawa et al. |
| 6,014,422 | A | 1/2000 | Boyd et al. |
| 6,025,260 | A | 2/2000 | Lien et al. |
| 6,093,508 | A | 7/2000 | Cote |
| 6,114,082 | A | 9/2000 | Hakey et al. |
| 6,150,256 | A | 11/2000 | Furukawa et al. |
| 6,165,893 | A | 12/2000 | Chung |
| 6,184,041 | B1 | 2/2001 | Furukawa et al. |
| 6,194,268 | B1 | 2/2001 | Furukawa et al. |
| 6,200,726 | B1 | 3/2001 | Chen et al. |
| 6,214,719 | B1 | 4/2001 | Nag |
| 6,221,562 | B1 | 4/2001 | Boyd et al. |
| 6,245,488 | B1 | 6/2001 | Furukawa et al. |
| 6,284,439 | B1 | 9/2001 | Holmes et al. |
| 6,313,492 | B1 | 11/2001 | Hakey et al. |
| 6,337,278 | B1 | 1/2002 | Butler |
| 6,338,934 | B1 | 1/2002 | Chen et al. |
| 6,440,635 | B1 | 8/2002 | Holmes et al. |
| 6,492,256 | B2 | 12/2002 | Lee et al. |
| 6,492,732 | B2 | 12/2002 | Lee et al. |
| 6,649,531 | B2 | 11/2003 | Cote et al. |
| 6,737,708 | B2 | 5/2004 | Zhang et al. |
| 6,780,753 | B2 | 8/2004 | Latchford et al. |
| 6,805,109 | B2 | 10/2004 | Cowan |
| 7,030,031 | B2 | 4/2006 | Wille et al. |
| 7,041,748 | B2 | 5/2006 | Lin et al. |
| 7,056,840 | B2 | 6/2006 | Miller et al. |
| 7,071,532 | B2 | 7/2006 | Geffken et al. |
| 7,091,611 | B2 | 8/2006 | Ahn et al. |
| 7,138,329 | B2 | 11/2006 | Lur et al. |
| 7,235,473 | B2 | 6/2007 | Jawarani et al. |
| 7,253,095 | B2 | 8/2007 | Lur et al. |
| 7,265,013 | B2 | 9/2007 | Furukawa et al. |
| 7,294,568 | B2 | 11/2007 | Goodner et al. |
| 7,294,934 | B2 | 11/2007 | Kloster et al. |
| 7,306,853 | B2 | 12/2007 | Lin et al. |
| 7,338,896 | B2 | 3/2008 | Vanhaelemeersch et al. |
| 7,344,827 | B2 | 3/2008 | Takemura et al. |
| 7,361,454 | B2 | 4/2008 | Kobayashi |
| 7,361,991 | B2 | 4/2008 | Saenger et al. |
| 7,432,041 | B2 | 10/2008 | Lin |
| 7,585,614 | B2 | 9/2009 | Furukawa et al. |
| 7,709,370 | B2 | 5/2010 | Allen et al. |
| 7,790,576 | B2 | 9/2010 | Bathan et al. |
| 7,919,225 | B2 | 4/2011 | Allen et al. |
| 7,968,382 | B2 | 6/2011 | Jinbo et al. |
| 8,236,599 | B2 | 8/2012 | Chang et al. |
| 8,586,404 | B2 | 11/2013 | Huang et al. |
| 2001/0021577 | A1 | 9/2001 | Brown et al. |
| 2001/0054766 | A1 | 12/2001 | Dirahoui et al. |
| 2002/0142531 | A1 | 10/2002 | Hsu et al. |
| 2002/0158337 | A1 | 10/2002 | Babich et al. |
| 2003/0012539 | A1 | 1/2003 | Mule' et al. |
| 2003/0127426 | A1 | 7/2003 | Chang et al. |
| 2004/0058277 | A1* | 3/2004 | He et al. .......... 430/296 |
| 2004/0094821 | A1 | 5/2004 | Lur et al. |
| 2004/0137241 | A1 | 7/2004 | Lin et al. |
| 2004/0196688 | A1 | 10/2004 | Yamamoto et al. |
| 2004/0207001 | A1 | 10/2004 | Kouznetsov et al. |
| 2005/0009305 | A1 | 1/2005 | Anderson et al. |
| 2006/0038212 | A1 | 2/2006 | Moore et al. |
| 2007/0099416 | A1 | 5/2007 | Furukawa et al. |
| 2007/0166981 | A1 | 7/2007 | Furukawa et al. |
| 2007/0249170 | A1 | 10/2007 | Kewley |
| 2008/0008969 | A1 | 1/2008 | Zhou et al. |
| 2008/0122106 | A1 | 5/2008 | Nitta et al. |
| 2008/0142995 | A1 | 6/2008 | Furukawa et al. |
| 2008/0150091 | A1 | 6/2008 | Lin |
| 2008/0176396 | A1 | 7/2008 | Futase et al. |
| 2008/0187731 | A1 | 8/2008 | Allen et al. |
| 2008/0265377 | A1 | 10/2008 | Clevenger et al. |
| 2009/0079075 | A1 | 3/2009 | Lin et al. |
| 2009/0079076 | A1 | 3/2009 | Lin et al. |
| 2009/0081418 | A1 | 3/2009 | Allen et al. |
| 2009/0149026 | A1 | 6/2009 | Zhou et al. |
| 2009/0166612 | A1 | 7/2009 | Cain et al. |
| 2009/0174067 | A1 | 7/2009 | Lin |
| 2009/0233226 | A1 | 9/2009 | Allen et al. |
| 2010/0009131 | A1 | 1/2010 | Basker et al. |
| 2010/0028801 | A1 | 2/2010 | Holmes et al. |
| 2010/0112463 | A1 | 5/2010 | Yune |
| 2010/0197096 | A1 | 8/2010 | Johnson et al. |
| 2010/0314768 | A1 | 12/2010 | Darnon et al. |
| 2011/0130006 | A1 | 6/2011 | Abatchev et al. |
| 2011/0304053 | A1 | 12/2011 | Lin et al. |
| 2012/0018891 | A1 | 1/2012 | Lin |
| 2012/0261829 | A1 | 10/2012 | Lin et al. |

OTHER PUBLICATIONS

Final Office Action for U.S. Appl. No. 13/088,110 mailed on Mar. 20, 2014.

Lin, Q., et al. "Self-Aligned Airgap Interconnect Structures and Methods of Fabrication" Non Final Office Action for U.S. Appl. No. 13/088,083 mailed on Oct. 24, 2013. (16 Pages).

Lin, Q., et al. "Self-Aligned Airgap Interconnect Structures and Methods of Fabrication" Non Final Office Action for U.S. Appl. No. 13/088,110 mailed on Nov. 5, 2013. (18 Pages).

Non Final Office Action issued on Jun. 18, 2013 for U.S. Appl. No. 13/197,325.

Non Final Office Action issued on Feb. 26, 2013 for U.S. Appl. No. 13/197,325.

Final Office Action mailed on May 27, 2014 for U.S. Appl. No. 13/606,788.

Maenhoudt, M., et al. "Alternative Process Schemes for Double Patterning That Eliminate the Intermediate Etch Step" Proc. of SPIE, vol. 6924, 69240P. Feb. 2008. pp. 1-12.

Jung, W., et al. "Patterning With Amorphous Carbon Spacer for Expanding the Resolution Limit of Current Lithography Tool" Proc. of SPIE, vol. 6520, 65201C. Feb. 2007. pp. 1-9.

Jung, W., et al. "Patterning With Spacer for Expanding the Resolution Limit of Current Lithography Tool" Proc. of SPIE, vol. 6156, 61561J. Feb. 2006. pp. 1-9.

Office Action mailed on Oct. 28, 2014 for U.S. Appl. No. 13/228,023.

Final Office Action mailed on Jan. 14, 2015 for U.S. Appl. No. 13/228,023.

* cited by examiner

INTERCONNECT STRUCTURE AND METHOD FOR FABRICATING ON-CHIP INTERCONNECT STRUCTURES BY IMAGE REVERSAL

RELATED APPLICATION INFORMATION

This application is related to commonly assigned application Ser. No. 13/088083, entitled: SELF-ALIGNED AIR-GAP INTERCONNECT STRUCTURES AND METHODS OF FABRICATION, and commonly assigned application Ser. No. 13/088110, entitled: MIDDLE OF LINE STRUCTURES AND METHODS FOR FABRICATION, both filed concurrently herewith and incorporated herein by reference.

BACKGROUND

1. Technical Field

The present invention relates to semiconductor interconnect structures and fabrication methods, and in particular to shaped interconnect structures made by image reversal patterning.

2. Description of the Related Art

The speed of propagation of interconnect signals is an important factor controlling overall circuit speed as feature sizes are reduced and the number of devices per unit area and number of interconnect levels are increased. Throughout the semiconductor industry, there has been a strong drive to reduce the dielectric constant, k, of the interlayer dielectric (ILD) materials used to electrically insulate metal lines. As a result, interconnect signals travel faster through conductors due to a reduction in resistance-capacitance (RC) delays.

Semiconductor chips may employ copper (Cu) as the electrical conductor inorganic organosilicates as the low dielectric constant (low-k) dielectric, and multiple levels of Cu/low-k interconnect layers. These Cu/low-k interconnect layers are fabricated with an iterative additive process, called dual-damascene, which includes several processing steps including, for example, film deposition, patterning by lithography and reactive ion etching, liner (Cu barrier) deposition, Cu metal fill by electrochemical plating, and chemical-mechanical polishing of excessive Cu metal.

Traditional dual-damascene integration suffers from poor reliability, particularly in porous low-k dielectric material. While hardmask layers may serve to protect the low-k material, the presence of sacrificial hardmask layers adds enormous process complexity and manufacturing as additional film deposition, pattern transfer etch, and removal of the hardmask layers are needed. Even with a hardmask, the process induced dielectric damage on the top surface of the dielectric results in a dielectric breakdown at this region during electrical reliability tests. The processes that could induce dielectric damage include chemical mechanical polishing, cleaning, and reactive ion etching.

A back-end-of-the-line (BEOL) integration process, called a low temperature oxide (LTO) process, employs a plurality of layers (e.g., up to 8) of sacrificial hardmask materials to fabricate a two-layer dual-damascene interconnect structure. Although immensely popular in semiconductor manufacturing, the dual-damascene integration scheme suffers from several drawbacks including the following. The dual-damascene integration scheme constitutes a significant portion of manufacturing cost of advanced semiconductor chips as many layers are needed to form connections. The dual-damascene integration scheme is a main yield detractor as the many layers of films needed to form the interconnects generates opportunities for defect introduction and, thus, degrade manufacturing yields. The dual damascene integration is very inefficient and embodies enormous complexity. The current dual-damascene integration scheme requires many sacrificial films (e.g., 80% of the film stack) to pattern and protect the fragile interlayer dielectric films from damage during processing. These sacrificial patterning and protective films have to be removed after patterning and copper plating.

In addition, the performance gain by introduction of new lower-k materials is often offset by the need for higher-k non-sacrificial protective materials, such as a cap layer, a hardmask layer, or a thicker copper barrier layer. The complex dual-damascene process lengthens manufacturing turn-around time and development cycles. Plasma etching processes for the dual-damascene integration scheme are also expensive and require significant up-front capital investment. The process induced dielectric damage can cause degradation in performance and reliability of the resultant chips.

SUMMARY

An interconnect structure includes a patterned and cured dielectric layer located directly on a surface of a patterned permanent antireflective coating. The patterned and cured dielectric layer and the permanent antireflective coating form shaped openings. The shaped openings include a sidewall having a tapered profile angle which narrows towards a top of the shaped openings. A conductive structure fills the shaped openings wherein the patterned and cured dielectric layer and the permanent antireflective coating each have a conductively filled region. The conductively filled region includes a shaped interconnect structure that offers the advantages of a longer distance between adjacent conductively filled regions (as compared with traditional near square structures), thus improving electrical reliability. The interconnect fabrication process preferably forms the shaped interconnect structures by image reversal patterning technique.

A method for fabricating an interconnect structure includes forming a permanent antireflective coating on a substrate; forming a pattern of shaped photoresist structures having a profile which narrows towards a top of the shaped structures directly on the permanent antireflective coating; filling spaces between the shaped photoresist structures with an interlevel dielectric composition wherein without substantially altering a shape and size of the shaped photoresist structures, and the interlevel dielectric composition includes a material that becomes a permanent interlevel dielectric layer; removing the shaped photoresist structures to provide shaped openings to form a reverse image pattern in the interlevel dielectric composition, the shaped openings having an inverse profile which narrows towards a top of the shaped openings; and filling the vias and trenches with an electrically conductive fill material.

Another method for fabricating an interconnect structure includes foil ling first shaped photoresist structures in a first photoresist wherein the first shaped photoresist structures include a profile which narrows towards a top of the shaped photoresist structures; filling spaces between the first shaped photoresist structures with a first interlevel dielectric composition wherein the filling does not substantially alter a shape and size of the first shaped photoresist structures and the first interlevel dielectric composition includes a material to become a first permanent interlevel dielectric layer; removing the first shaped photoresist structures to provide a reverse image pattern forming first shaped openings in the first interlevel dielectric composition, the first shaped openings including an inverse profile which narrows towards a top of the first shaped openings; forming second photoresist structures in a second photoresist on top of the first permanent interlevel dielectric layer; filling spaces between the second photoresist structures with a second interlevel dielectric composition wherein the filling does not substantially alter a shape and size of the second photoresist structures and the second interlevel dielectric composition includes a material to become a permanent interlevel dielectric layer; removing the second photoresist structures to form second shaped openings to provide a reverse image pattern for forming interconnect structures; and filling the reverse image pattern of the permanent first and second interlevel dielectric layers with an electrically conductive fill material to form interconnect structures.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
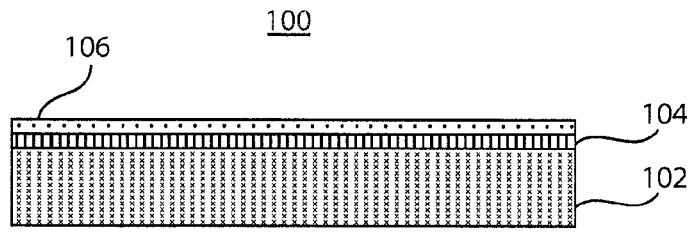
FIGS. 1A-1J show cross-sectional views of a device demonstrating a process flow for a single-damascene process according to an illustrative embodiment.

The present principles provide shaped interconnect structures and methods for fabrication. In particularly useful embodiments, single-and dual-damascene shaped interconnect structures are formed by image reversal patterning wherein shaped interconnect structures are formed in resist structures in a shape that narrows towards a top. The top is the portion away from or opposite the substrate. The resist structures are buried in an interlevel dielectric composition. The resist structures are removed from the interlevel dielectric composition and the interlevel dielectric composition becomes or is changed by a cure process into a permanent patterned on-chip dielectric.

Advantages of the present invention include: 1) providing shaped interconnect structures for improved electrical reliability as the distance between the metal at the top of a particular dielectric level is greater than for traditional (square) structures; 2) simplifying integration processes as reactive ion etching and its related hardmask are not needed and thus saving manufacturing costs; 3) reactive ion etching (RIE) is not needed to form the shaped interconnect structured, thus reducing dielectric damage by RIE and improving performance and reliability. Moreover, the methods disclosed herein also afford shaped interconnect structures that are not possible to fabricate with traditional reactive ion etching techniques.

The image reversal patterning technique permits the formation of customizable opening shapes. The opening shapes are employed (as reverse images) to be filled by conductive material to form single or dual damascene conductive structures. This flexibility permits the control of the conductor shape. In one embodiment, a single or dual damascene structure has a trapezoidal cross-sectional shape. When the conductive structures tapers toward its top (e.g., trapezoidal cross-sectional shape), the profile may be referred to as an inverse profile. Single or dual damascene structures typically fail at a top layer of the dielectric between metal structures in each metal layer. The inverse conductor profile extends the distance between two adjacent metal structures within each metal layer at top of the structure. This longer distance effectively reduces the applied electrical field, thus greater reliability can be achieved.

An antireflective coating (ARC) may be employed in some embodiments. An illustrative method for fabricating, e.g., a dual damascene structure, in accordance with one illustrative embodiments may include, optionally, depositing an antireflective layer on a substrate, depositing a first positive- or negative-tone photoresist and performing a pattern-wise exposure to irradiation with an inversed-tone mask, e.g. UV light, EUV, E-beam. Patterns (e.g., pillar or line) are formed by selective removal of the unexposed areas (e.g., development) to form first beneficial photoresist shapes. Then, the first photoresist pattern is filled with an interlevel dielectric (ILD) composition without substantially altering the shape and the size of the photoresist patterns. Excess ILD may be removed by a wet or dry method to expose the top surface of the first photoresist pattern.

An inverted ILD pattern is formed by removing remaining resist with a wet or dry method, and depositing a second positive- or negative-tone photoresist followed by pattern-wise exposure to irradiation with an inversed-tone mask, e.g. UV light, EUV, E-beam, etc. Second resist patterns are formed by selective removal of the exposed (or unexposed) areas (e.g., development). The second patterned resist/ILD composite is formed by filling the openings of first and second resist patterns with an ILD. An inverse tone ILD dual damascene pattern is formed by removing remaining resist with a wet or dry method. The dual damascene ILD structure may be cured by heat and/or irradiation energy (heat, UV, electron beam, microwave or a combination thereof). Additional steps may include standard, cap layer/ARC layer opening, metallization, chemical mechanical polishing (CMP), cap layer deposition, etc. The dual-damascene dielectric interconnect is filled with a conductive fill material.

In some embodiments, an antireflective coating is formed on the semiconductor substrate prior to depositing the photoresist. In some embodiments, when an ARC is used, the ARC and patternable low-k materials are part of a permanent dielectric material stack of the interconnect structure.

In another embodiment, a material stack comprising a dielectric cap and an antireflective coating is formed on top of the substrate prior to depositing the photoresist. When such materials are present, a step of forming contact holes through the antireflective coating or material stack may be performed. The contact holes enable subsequent contact to the underlying substrate.

A planarization process such as chemical mechanical polishing may follow the interconnect pattern fill with a conductive material. In another embodiment, a dielectric cap may be formed atop the cured second patternable material after filling and planarizing.

In accordance with the present principles, a number of photoresist steps and all other sacrificial materials and their related deposition, pattern transfer (etch) and removal process used in prior art integration are reduced. In addition, the need for plasma etching, which is typically employed in patterning processes, is minimized. The reduced use of plasma etching reduces plasma-induced dielectric material damage, thus maintaining the performance gain for the introduction of lower dielectric constant on-chip insulators. Further, the methods as described herein reduce a number of layers needed to fabricate an interconnect structure and, as such, reduce the time and cost of fabricating interconnect structures as compared to prior art processes.

In the following description, numerous specific details are set forth, such as particular structures, components, materials, dimensions, processing steps and techniques, to provide a thorough understanding of the present principles. However, it will be appreciated by one of ordinary skill in the art that these specific details are illustrative and should not be construed as limiting.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the interlayer dielectric materials employed herein may act as a low-k (low dielectric constant) dielectric insulator after a cure process. The cured product of an interlayer dielectric material, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of an interlayer dielectric material is the product of the interlayer dielectric material after it has undergone a cure process. The "cured" product of an interlayer dielectric material may be different from the original interlayer dielectric material in chemical nature and physical, mechanical and electrical properties.

It is to be understood that the present invention will be described in terms of a given illustrative architecture having a semiconductor wafer or substrate; however, other architectures, structures, substrate materials and process features and steps may be varied within the scope of the present invention.

Circuits or structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The described embodiments demonstrate image reversal processes. An image reversal is where positively formed (e.g., mask lines, resist lines or features etc.) features will result in negative features being formed (e.g., vias and trenches) and vise versa. The negative features in the present embodiments will then be employed for forming interconnect structures or the like. The interconnect structures are formed without etching interlevel dielectric layers to form trenches or vias. Instead, photoresists are employed to shape these trenches or vias and may function as a permanent interlevel dielectric layer as well. In addition, the interlevel dielectric material can be formed to provide a plurality of different vertical profiles.

Referring now to the drawings in which like numerals represent the same or similar elements and initially to FIGS. 1A-1J, a single-damascene method and structure 100 are shown in accordance with one illustrative embodiment. FIG. 1A shows a substrate 102 having an optional cap layer 104 and optional antireflection coating (ARC) 106 formed over the substrate 102. Although both layers 104 and 106 are shown, it should be understood that the cap layer 104 and ARC 106 may be employed without the other or may not be used at all.

The substrate 102 may include a semiconductor substrate, e.g., silicon GaAS, silicon on insulator, or may include lower levels metal layers in interlevel dielectric materials. The substrate 102 may include an electrically semiconducting material, an insulating material, a conductive material, devices or structures made of these materials or any combination thereof (e.g., a lower level of an interconnect structure). When the substrate 102 is comprised of a semiconducting material, any semiconductor such as Si, SiGe, SiGeC, SiC, Ge alloys, GaAs, InAs, InP and other III/V or II/VI compound semiconductors, or organic semiconductors may be employed. The substrate 102 may also be a flexible substrate including devices that are suitable for high-speed roll-to-roll processing. In addition to these listed types of semiconducting materials, substrate 102 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices.

When the substrate 102 is an electrical insulating material, the insulating material can be an organic insulator, an inorganic insulator or a combination thereof including multilayers. The substrate 102 may also include a patternable low-k dielectric material as well. These electrical insulating materials may be part of a device, or devices or structures, which may be discrete or interconnected. These devices and structures may be for logic applications or memory applications. When the substrate 102 is an electrically conducting material, the substrate may include, for example, polysilicon, an elemental metal, an alloy including at least one elemental metal, a metal silicide, a metal nitride or combinations thereof including multilayers. When the substrate 100 includes a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

The optional cap 104 may be formed on the surface of substrate 102 utilizing a conventional deposition process such as, for example, chemical vapor deposition (CVD), plasma enhanced chemical vapor deposition (PECVD), atomic layer deposition (ALD), chemical solution deposition (such as spin coating), or evaporation. The dielectric cap 104 may include any suitable dielectric capping material such as, for example, SiC, SiN, $SiO_2$, a carbon doped oxide, a nitrogen and hydrogen doped silicon carbide SiC(N,H) or multilayers thereof. Dielectric cap 104 may be a continuous layer or a discontinuous layer. Dielectric cap 104 may also be a layer with graded composition in the vertical direction, or dielectric cap 104 may be a select cap, such as CoWP.

After the deposition of the dielectric cap 104, a post deposition treatment may be applied to modify the properties of either the entire layer or the surface of the dielectric cap 104. This post deposition treatment can be selected from heat treatment, irradiation of electromagnetic wave (such as of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the dielectric cap 104, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate 102 can withstand, usually about 500° C. This heat treatment can be conducted in an inert environment or within a chemical environment in a gas phase or a liquid phase. This treatment step may or may not be performed in the same tool as that used in forming the dielectric cap 104.

The post deposition treatment by irradiation of electromagnetic waves can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions may be employed in some embodiments: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap 104.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap 104.

The post deposition chemical treatment may also be conducted in a gas phase or a liquid phase. In one embodiment, the following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire layer of dielectric cap 104 or may be limited only to the surface of the dielectric cap 104. Example chemicals include adhesion promoters such as silanes, siloxanes and silylation agents. This treatment step may or may not be performed in the same tool as that used in forming the dielectric cap 104.

The thickness of the dielectric cap 104 may vary depending on the technique used to form the same as well as the material make-up of the layer. The dielectric cap 104 may have a thickness from 2 nm to 55 nm, and more preferably a thickness from 10 mn to 45 nm.

Next, the optional ARC 106 is formed on a surface of the optional dielectric cap 104, if present, or directly on a surface of the substrate 102 when the dielectric cap 104 is not present. The ARC 106 may be a single layer, multilayer or a graded layer with a composition that varies along the vertical direction. The ARC 106: (i) acts as an antireflective coating (ARC) during a lithographic patterning process; (ii) withstands high-temperature back-end-of line (BEOL) integration processing (e.g., up to about 500° C.); (iii) prevents resist (e.g., the patternable low-k material) poisoning by the substrate 102; (iv) provides a vertical wall profile and sufficient etch selectivity between the patternable low-k material and the ARC layer 106; (v) serves as a permanent dielectric layer in a chip (low dielectric constant, e.g., k<5, more commonly k<3.6); and (vi) is compatible with conventional BEOL integration and produces reliable hardware.

Antireflective coatings are known to those skilled in the art and include, for example, organic homopolymers or copolymers of polyesters, polyimides, polyacrylates, polymethacrylates, polysulfones, and amorphous carbon that satisfy all of the characteristics of ARC 106 mentioned above. The ARC 106 may be applied by spin-on techniques, spray on techniques, dipping, etc. Inorganic antireflective coatings, such as silicon oxynitride (SiON), silicon carbide (SiC), silicon oxy-carbide (SiOC), SiCOH, siloxane, silane, carbosilane, oxy-carbosilane, and silsesquioxane, either as a polymer or a copolymer may also be employed and may be deposited, for example, by plasma-enhanced chemical vapor deposition, spin-on techniques, dipping, etc. The ARC 106 may include atoms of M, carbon (C) and hydrogen (H), wherein M is at least one of Si, Ge, B, Sn, Fe, Ta, Ti, Ni, Hf and La.

When ARC 106 is a multilayer ARC, the deposition of each layer may be the same or a combination of deposition methods can be used. After applying ARC 106, particularly those from a liquid phase, a post deposition baking step is usually needed to remove unwanted components, such as solvent, and to effect crosslinking. The post deposition baking step of ARC 106 is typically, but not necessarily always, performed at a temperature from 80° C. to 300° C., with a baking temperature from 120° C. to 200° C. being even more typical. Other post-deposition treatments (e.g., similar too cap layer 104) may be performed.

Figure 1B:
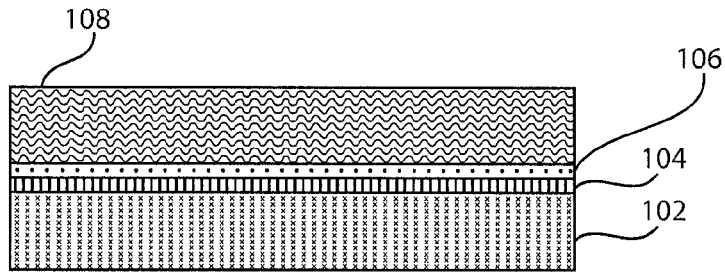

In FIG. 1B, a photoresist material 108 is deposited. The material 108 may include chemically amplified photoresists, non-chemically amplified photoresists, positive-tone or negative tone. Processing of material 108 may include a deposition process including, for example, spin-on-coating, dip coating, brush coating, and ink-jet dispensing. After applying the material 108, a post deposition baking step may be performed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

The thickness of the material 108 may vary depending on the requirements of a chip being fabricated, the method being employed to form the same, and the make-up of the material 108. The photoresist material 108 may have a thickness from 1 nm to 50,000 nm, with a thickness from 20 nm to 5000 nm being preferred. The pattern-wise exposing process can be accomplished in a variety of ways, including, for example, exposure through a mask with a lithography stepper or a scanner with an exposure light source of G-line, I-line (365 nm), DUV (248 nm, 193 nm, 157 nm, 126 nm), Extreme UV (EUV) (13.4 nm, 6.5nm), an electron beam, an ion beam, etc. The exposing process may be performed in a dry mode or an immersion mode. The exposing process may be performed with a single exposure or multiple exposures. The pattern-wise exposing process may include direct writing without the use of a mask with, for example, light, electron beam, ion beam, and scanning probe lithography. Other patterning techniques that can be used include contact printing techniques such as nanoimprint lithography, embossing, micro contact printing, replica molding, microtransfer molding, micromolding in capillaries and solvent-assisted micromolding, thermal assisted embossing, inject printing, and the like.

An optional post-exposure baking may be employed to effect the photochemical reactions. When performed, the baking step is conducted at a temperature from 60° to 200° C., with a baking temperature from 80° to 140° C. being even more typical. The duration of the baking step varies and is not critical to the practice of the present invention.

Figure 1C:
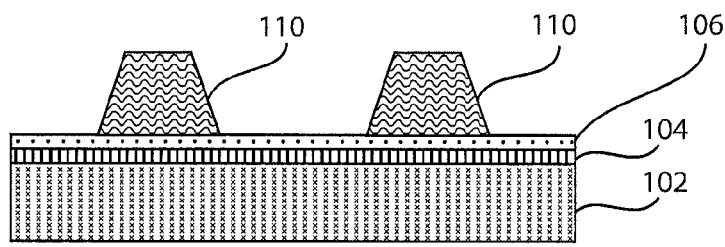

Referring to FIG. 1C, a reversed-tone mask and a positive- or negative-tone photoresist 108 are employed to form features 110 with vias or trenches therebetween. The features 110 provide a reverse image for the later formed interconnect vias and trenches. Since the photoresist features 110 are patterned using lithographic methods, the pattern features 110 may be formed with a plurality of different shapes. In one embodiment, the shapes include a trapezoidal cross-section as depicted.

After exposure and post-exposure baking, latent images or patterns are developed into relief images or patterns 110 with an appropriate developer, usually an aqueous base solution, such as, e.g., 0.26 N tetramethylammoniahydroxide (TMAH) solution.

Figure 1D:
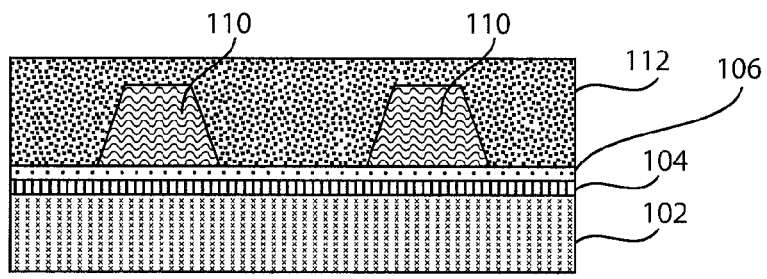

Referring to FIG. 1D, an interlevel dielectric (ILD) 112 is deposited. The deposition process includes, for example, spin-on-coating, dip coating, brush coating, doctor blade coating, and ink-jet dispensing. The ILD 112 is formulated such that it is compatible with the underlying photoresist pattern 110, i.e., the application of the ILD 112 does not substantially alter the dimension and profile of the resist patterns 110. After applying the ILD material, a post deposition baking step may be employed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

The ILD 112 includes any dielectric material compositions that are compatible with the pattern photoresist structures. In one embodiment, the ILD 112 may be used as deposited as a permanent ILD. In another embodiment, the ILD 112 may be cured to form a patterned permanent dielectric (e.g., the ILD 112 is a photo-patternable low k (PPLK) material). It is noted that the photo-patternable low k materials are subsequently converted into a low-k dielectric insulator during a post patterning cure process. The cured product of a PPLK material, therefore, can serve as a permanent on-chip dielectric insulator. The photo-patternable low k material employed herein can be deposited from a liquid phase. In the present disclosure, the terms "cure" or "curing" are used interchangeably to refer one of the processes selected from a thermal cure, an electron beam cure, an ultra-violet (UV) cure, an ion beam cure, a plasma cure, a microwave cure or a combination thereof.

A "cured" product of a photo-patternable low k material is the product of the photo-patternable low k material after it has undergone one of the aforementioned cure processes. The "cured" product of a photo-patternable low k material is different from the photo-patternable low k material in chemical nature and physical, mechanical and electrical properties.

The term "photo-patternable low k material" (or PPLK) includes a functionalized polymer, copolymer or blend including at least two of any combination of polymers and/or copolymers having one or more acid-sensitive imageable groups. The PPLK material acts as a photoresist and after curing it is converted into a dielectric material having a dielectric constant of about 4.3 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described herein.

The PPLK material is a photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed is a photo-patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be a photo-patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally, the PPLK material may be a photo-patternable composition further comprising at least one microscopic pore generator (porogen). The pore generator may be or may not be photo/acid sensitive.

Illustrative polymers for the PPLK material include, but are not limited to, siloxane, silane, carbosilane, oxycarbosilane, silsesquioxane-type polymers including caged, linear, branched or combinations thereof. In one embodiment, the PPLK material is a photo-patternable composition comprising a blend of these photo/acid-sensitive polymers.

The PPLK material is formed from a photo-patternable composition (negative-tone or positive-tone) that includes at least one of the above mentioned polymers, copolymers or blends, a photoacid generator, a base additive and a solvent used in a photoresist composition. When the PPLK material is a negative-tone photo-patternable material, it may be formed from a patternable composition optionally including an additional cross-linker. By "negative-tone" it is meant that the part of the PPLK material that is exposed to an actinic irradiation will not be removed by a conventional developer, while the unexposed part of the PPLK material is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone photo-patternable material, it is formed from a patternable composition that includes at least one of the above mentioned polymers, copolymers or blends wherein the polymers, copolymers or blends containing at least photo/acid imageable functional group to form positive-tone patterns, a photoacid generator, a base additive and a solvent used in a photoresist. By 'positive-tone" it is meant that the part of the PPLK material that is exposed to an actinic irradiation will be removed by a conventional developer, while the unexposed part of the PPLK material is not removed. The photoacid generators, base additives and solvents are well known to those skilled in the art.

Figure 1E:
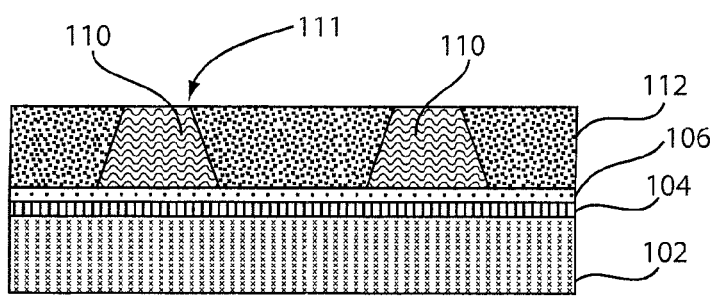

Referring to FIG. 1E, the ILD 112 is polished or etched down to the pattern 110 to remove excess ILD 112 by dry etching, wet etching, polishing or other methods to expose a resist top surface 111. This polishing or etching provides access to the resist pattern structure 110 to enable removal. The resist pattern 110 may be removed by a wet method, a dry method, heat, UV light or a combination thereof In one embodiment, a wet method is employed with an appropriate developer. In another embodiment, a dry method is employed with an appropriate selective reactive ion etching that removes only the exposed resist. In yet another embodiment, a dry method is employed by using heat or UV irradiation to remove exposed resist. These selective removal methods leave desired trapezoidal openings 114 (FIG. 1F) within the dielectric layer 112 wherein the shaped openings include a profile which narrows towards a top of the shaped opening structures.

Figure 1F:
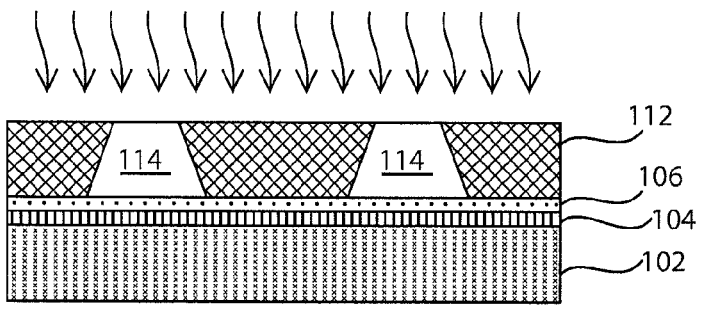
Figure 1G:
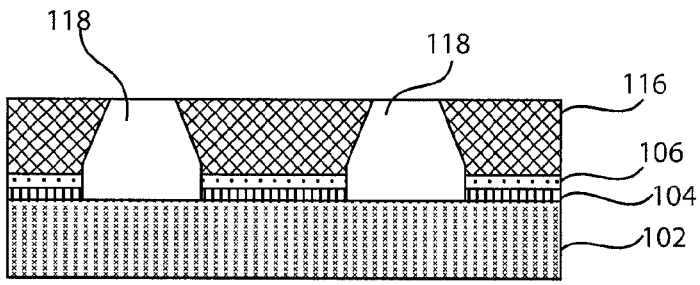

Referring to FIG. 1F, the absence of resist pattern 110 leaves openings 114 that form an interconnect pattern 118 (see FIG. 1G). The openings 114 have the patterned shape previously created. The patterned dielectric structure is formed by removing the resist 110 and curing the ILD 112 composite structures. The curing is optional depending on material selection for ILD 112 and may be performed with heat, UV, or E-beam (tone inversion in ILD) to form a permanent (cured) interconnect dielectric layer 116. After forming the interconnect pattern of shaped openings 118 (and curing to form the ILD 116, if needed), a patterned (and cured) dielectric material 116, as shown in FIG. 1G, provides a permanent dielectric material which is employed to insulate conductive structures. Depending on the material selection ILD 112 may not need to be processed to become the permanent ILD 116 and may instead become the permanent ILD 116 upon its formation (as layer ILD 112).

Curing, if needed, may be performed by a thermal cure, an electron beam cure, an ultra-violet (UV) cure, an ion beam cure, a plasma cure, a microwave cure or a combination thereof The conditions for each of the curing processes are well known to those skilled in the art and any condition can be chosen as long as it converts the interlevel dielectric composition into a low k film and maintains pattern fidelity.

In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof. The excimer laser may be generated from at least one of the excimers selected from the group consisting of $Ar_e^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He and Ar. The UV/thermal cure temperature may be from 100° C. to 500° C., with a cure temperature from 300° C. to 450° C. being more common. The duration of the UV/thermal cure is from 0.5 min to 30 min with duration from 1 min to 10 min being more common. The UV cure module is designed to have a very low oxygen content to avoid degradation of the resultant dielectric materials. This post-patterning cure, if performed, may be in different or the same tool cluster as that of the patterning step.

The thickness of the patterned and cured interlevel dielectric (ILD) 116 may vary depending on the requirements of the chip and the technique used to form the same as well as the material make-up of the layer. The patterned and cured ILD 116 may have a thickness, e.g., from 1 nm to 50000 nm, with a thickness from 10 nm to 5000 nm being preferable.

Referring again to FIG. 1G, if ARC 106 or cap layer 104 are employed, a cap open process is employed to expose the underlying substrate 102 (or metal lines). The cap open process preferably includes an etching process that selectively etches one or both of the ARC 106 and/or cap layer 104 relative to the layer 116.

Figure 1H:
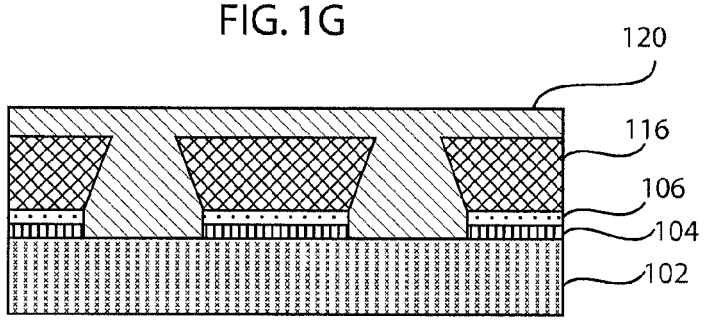

Referring to FIG. 1H, a metallization process includes depositing a conductor 120 into shaped openings 118 (FIG. 1G) in layer 116 and over a top surface of dielectric layer 116. The conductor 120 may include copper, aluminum, tungsten, titanium, doped polysilicon or any other useful conductive material, or alloys/combinations thereof The conductor 120 may be deposited using chemical vapor deposition (CVD) or other deposition techniques. The openings 118 are filled with conductive material 120 and include the shapes of the openings 118 as provided by the image reversal.

Figure 1I:
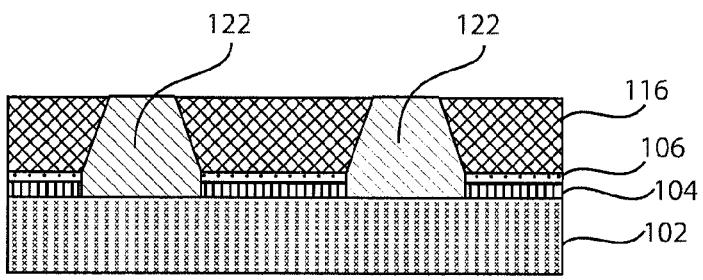

Referring to FIG. 1I, a chemical-mechanical polish (CMP) is performed to remove excess conductor 120 from the surface of dielectric layer 116 to form a conductive structure (e.g., metal line or via) 122 in a single damascene process. Other planarization processes may also be employed.

The structure 122 may include a trapezoidal cross-section, but may include other graduated shapes or stepped shapes. in the present example, the structure 122 has less width at its upper portion and a greater width at its base. In this way, the upper portion is necked down to connect with a conductive structure in a higher layer (not shown). The reduction is size of the upper portion reduces the risk of shorts between neighboring conductive structures 122 and permits the structures 122 to be taller than conventional structures. This further enables increased reliability in the device.

Figure 1J:
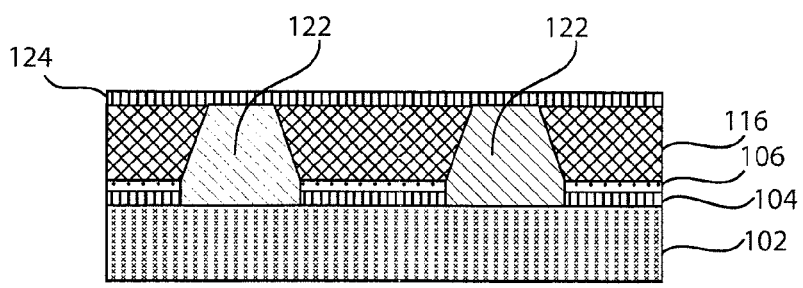

Referring to FIG. 1J, a cap deposition may be employed to form a cap layer 124 prior to beginning a next metallization layer for connecting the substrate 102 (or lower metallization) to a higher conductor (not shown) using a single damascene integration.

The present process enables a wider choice of patterning materials, e.g., any spin-on ILD 112 may be employed. Well-developed resists and lithography techniques may be employed including both positive-tone, negative-tone resists. The present methods are compatible with immersion lithography and multi-exposure patterning. The present methods generate an ILD profile using resist materials and patterning, which are not possible with ILD formation with etching alone. E.g., a super-vertical ILD profile, an inverse ILD profile, etc. The present method offer ways to reduce Line Edge Roughness (LER) through post resist patterning cure processes.

Figure 2A:
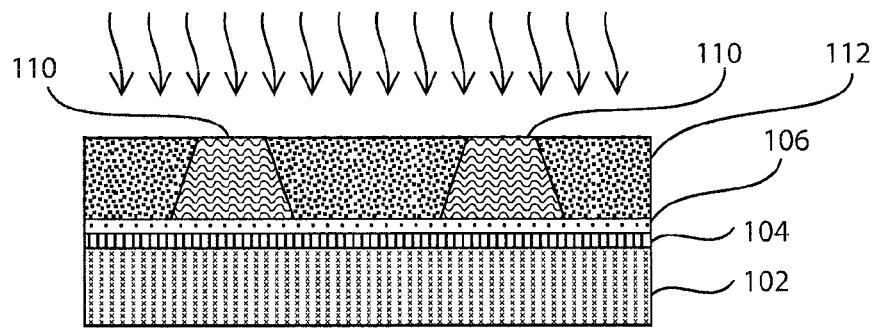
FIGS. 2A-2D show cross-sectional views of a device demonstrating another process flow for a single-damascene process according to another illustrative embodiment.
Figure 2B:
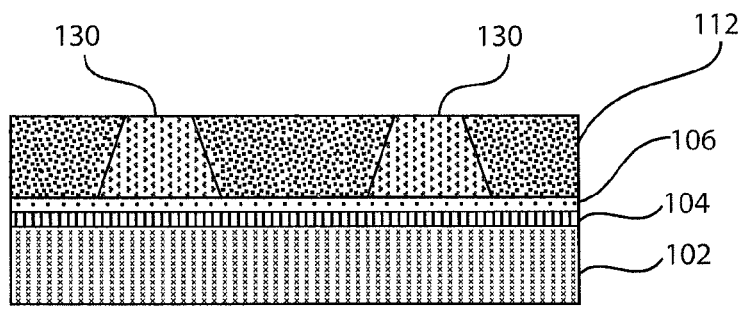

Advantages of the present principles provide shaped interconnect structures with improved electrical reliability as the distance between metal portions at a top of particular dielectric level is a greater distance than traditional (square) structures. The integration process is simplified to save manufacturing costs by eliminating steps. No reactive ion etching (RIE) is needed to form the shaped interconnect structures, thus dielectric damage by RIE is reduced, and performance and reliability are improved Referring to FIG. 2A, after the planarizing step of FIG. 1E, another method for forming single damascene structures is illustratively shown. The resist pattern 110, which may include a positive-tone photoresist, which is exposed to a blanket irradiation. The irradiation (and optional subsequent baking) causes chemical transformation in an exposed resist 130 in FIG. 2B.

Figure 2C:
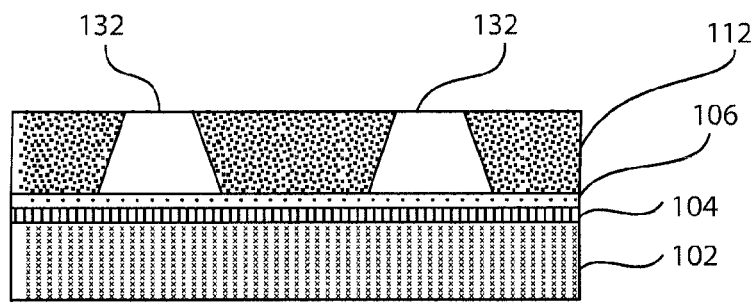

Referring to FIG. 2C, patterns (vias or trenches opened) 132 are formed by selective removal of the exposed areas by a liquid (development). This forms a pattern in the ILD 112 which is the shape of the removed material.

Figure 2D:
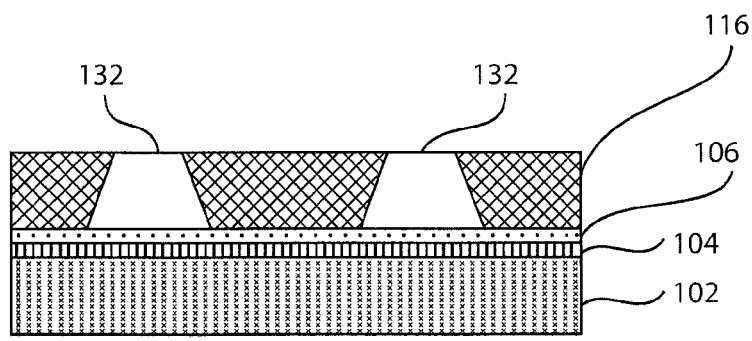

Referring to FIG. 2D, a cure step as described with respect to FIG. 1F may be performed to convert the photoresist ILD 112 into the interlevel dielectric layer 116 as described above, if needed. Processing continues as in FIGS. 1G-FIG. 1J.

Figure 3A:
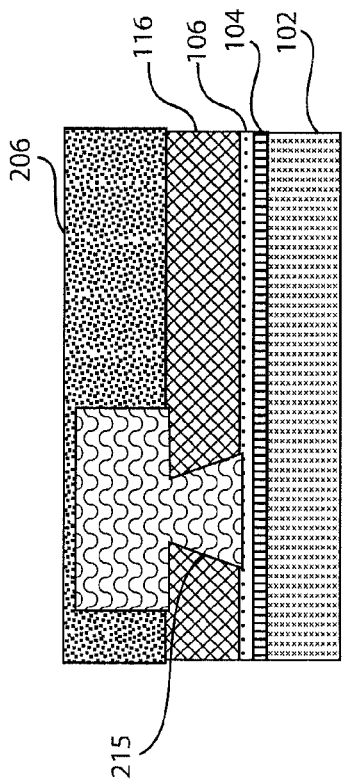
FIG. 3A-3F show cross-sectional views of a device demonstrating a process flow for a dual-damascene process according to an illustrative embodiment.

Referring to FIG. 3A, another illustrative embodiment may be employed for dual-damascene structure integration. The process steps for this embodiment follow those of FIGS. 1A-1F. Note the pitched sidewalls of opening 215. In one embodiment, after curing the ILD 112 to form ILD 116 (if needed), in FIG. 3A, a second photoresist 202 is formed on the ILD layer 116 and fills an opening (215) formed by removing the photoresist features 110. The second resist 202 may include a positive- or negative-tone photoresist.

Figure 3C:
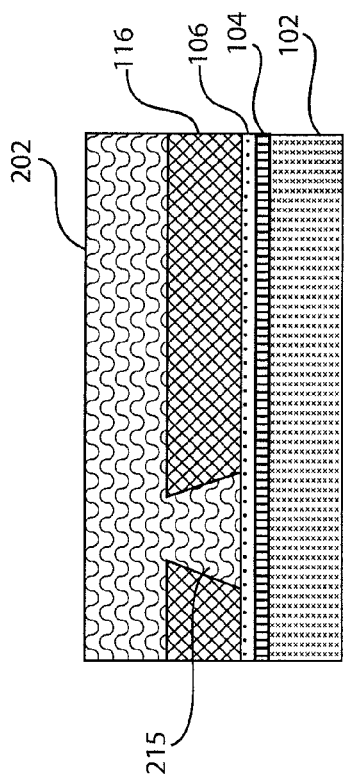
Figure 3B:
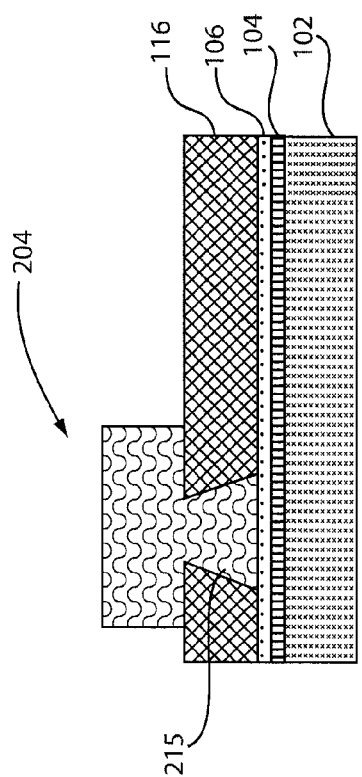

Referring to FIG. 3B, second resist 202 is patterned using a pattern-wise exposure to irradiation, e.g., UV light, EUV, E-beam, etc. Dual damascene patterns 204 are formed by selective removal of the exposed (or unexposed) areas by a liquid (development).

Figure 3D:
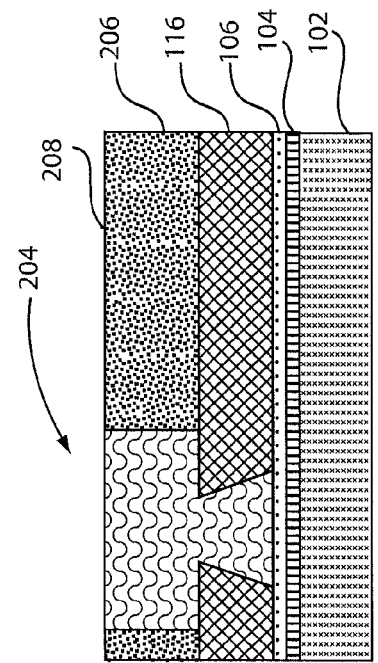
Figure 3E:
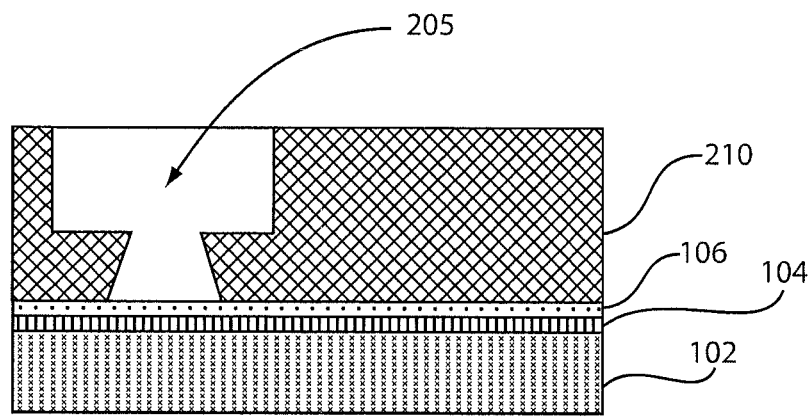
Figure 3F:
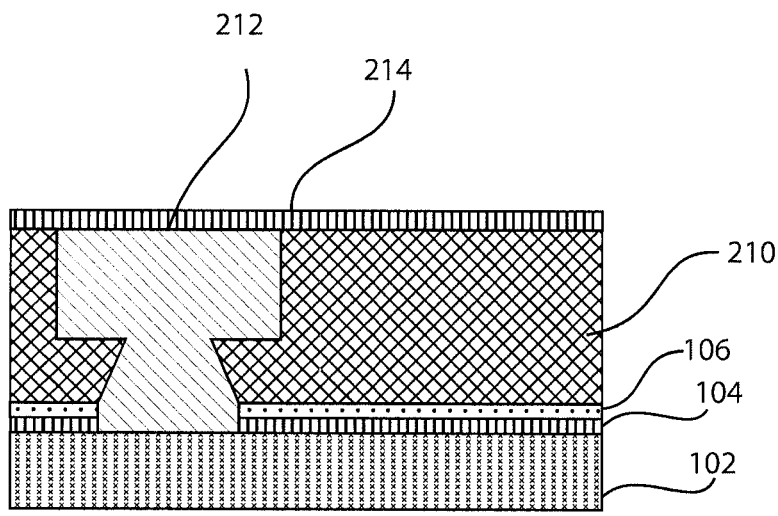

Referring to FIG. 3C, ILD layer 206 (equivalent to layer 112) is deposited to fill between resist structures 204 (only one is depicted). ILD composition 206 can be the same or different from ILD composition 112. In FIG. 3D, a surface 208 of layer 206 is planarized to expose the second resist pattern 204 using the same method described in the single damascene case. In FIG. 3E, the second resist 204 is developed or otherwise removed using the same method described in the single damascene case. This leaves an open dual damascene structure 205 in the ILD layer 206. The ILD 206 is then cured, if needed, by heat and/or irradiation energy (heat, UV, electron beam) to form a patterned and cured dielectric layer 210. In FIG. 3F, if present, an ARC layer 106 and/or a cap layer 104 are opened up and a metallization process is performed. The metallization process includes depositing a conductive material in open structure 205 (and opened ARC 106 and cap layer 104) and planarizing the conductive material to form a dual damascene interconnect 212. A cap layer 214 may be formed over the dual damascene interconnect structure 212. The process may be continued with other layers and back end or the line (BEOL) processing.

Figure 4A:
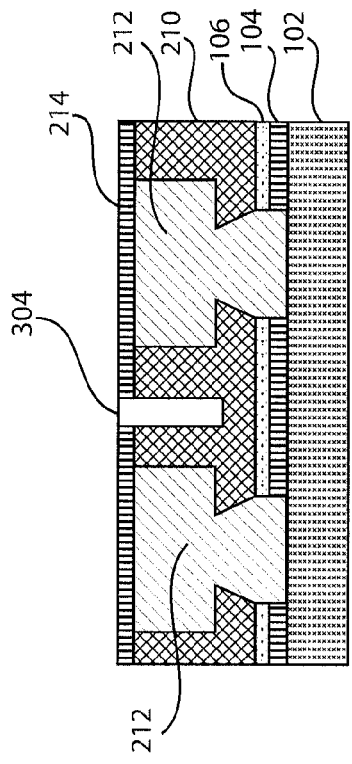
FIG. 4A-4D show cross-sectional views of the device of FIG. 3F demonstrating a process flow for forming air gaps between conductive dual-damascene structures according to an illustrative embodiment.

In one embodiment, the further processing may include the formation of air gaps between dual damascene structures. Beginning with the structure of FIG. 3F, additional processing steps may take advantage of the cured second interlevel dielectric layer 210. Referring to FIG. 4A, a mask layer 302 is formed over the cap layer 212. The layer 302 may include a resist material or other compatible mask material.

Figure 4B:
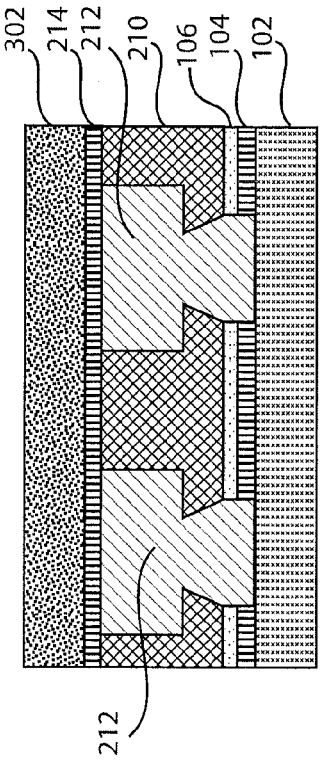
Figure 4C:
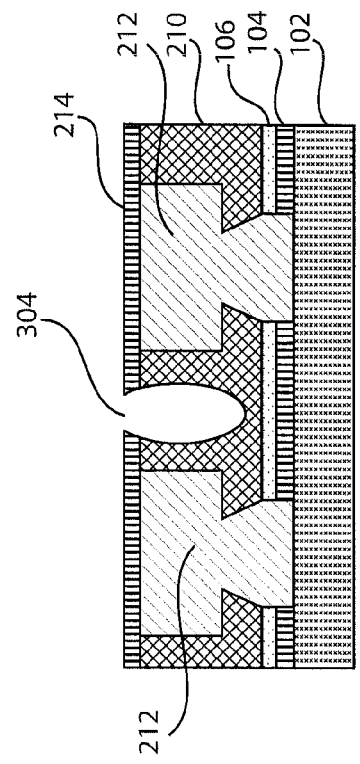

In FIG. 4B, the mask layer 302 is patterned and holes 304 are opened up between dual damascene structures 212 through the cap layer 214 and into the second dielectric layer 210. The mask layer 302 is removed as shown in FIG. 4C.

Figure 4D:
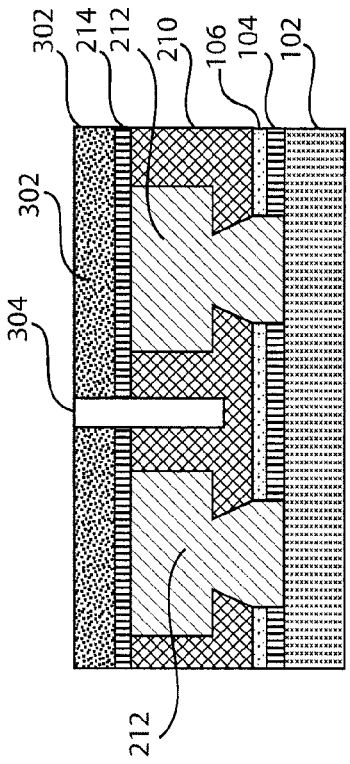

Referring to FIG. 4D, an etch process is performed to open up the second dielectric layer 210 to form a larger air gap 308 between structures 212. The etch process may include a reactive ion etch, or other suitable etching process. An ARC layer or other cap layer 214 may be formed by a deposition process to cap the air gap 308, and processing may continue.

The air gap formation process described with reference to FIG. 4 may be applied to different structures. These structures may take advantage of the ability of the resist patterns/layers 210, 116 to provide different vertical profiles for single damascene and dual damascene structures. Such profiles may include trapezoidal shapes, stepped shapes, asymmetric shapes, angled sidewalls, etc. Using the reverse imaging techniques described herein, the exposure process for resist materials is employed to form the cavities into which conductive structures are formed. This avoids the use of etching techniques to form these cavities and results in better dimensional accuracy and reliability of the conductive structures.

Figure 5A:
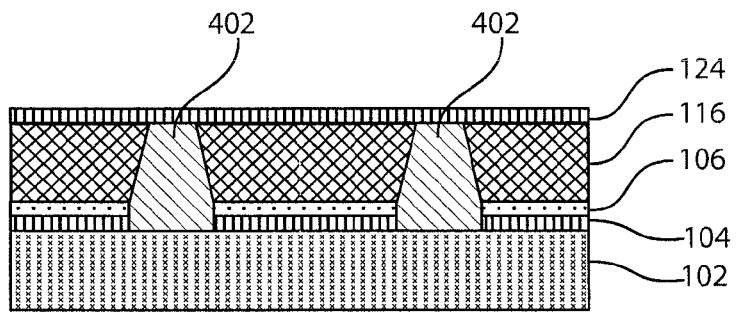
FIGS. 5A-5B show cross-sectional views of single damascene structures with sidewalls having an inverse vertical profile and with air gaps (FIG. 5B) formed in accordance with one illustrative embodiment.
Figure 5B:
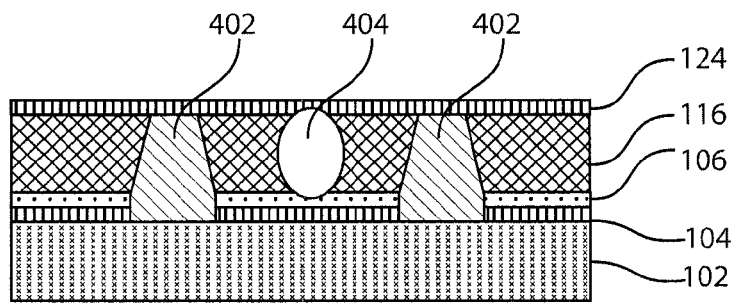

In one example, a single damascene structure includes trapezoidal cross-sectional shaped metallization structures 402 depicted in FIG. 5A. FIG. 5B shows the trapezoidal shaped metallization 402 with an air gap 404 formed between structures 402. A cap layer 124 (or ARC may be formed over the air gap 404). Note that the structures 402 may form lines with a trapezoidal cross-sections or may form contacts which would include a four-sided tapered structure narrowed at the top.

Figure 6:
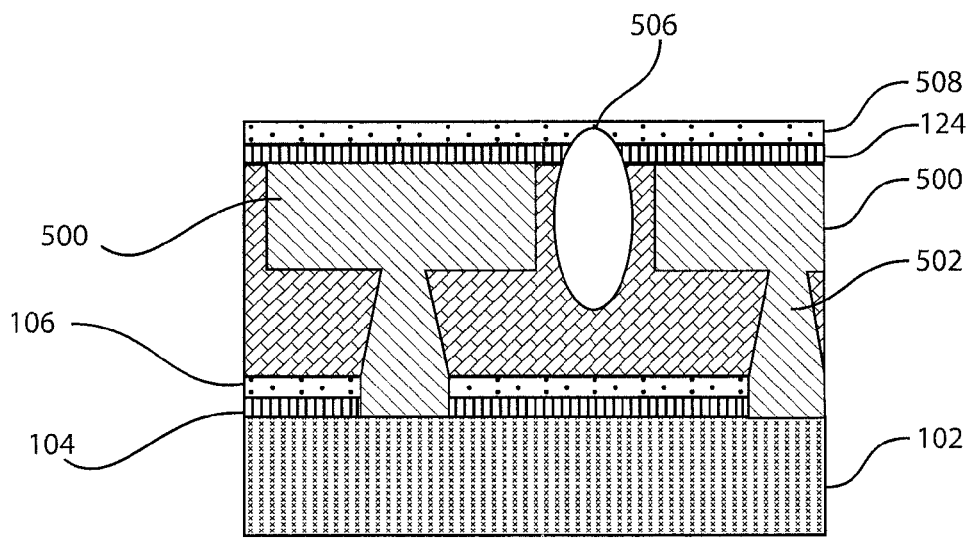
FIG. 6 shows a cross-sectional view of a device having conductive structures with an inverse profile and with air gaps formed in accordance with one illustrative embodiment.

FIG. 6 shows a dual damascene structure 500, which includes a trapezoidal shaped via 502 formed in ILD 210. The dual damascene structures 504 have an air gap 506 formed therebetween. The cap layer 214 includes and ARC 508 formed thereon.

Having described preferred embodiments for interconnect structures and methods for fabricating on-chip interconnect structures by image reversal (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an interconnect structure comprising:

forming a permanent antireflective coating on a substrate;

forming a pattern of shaped photoresist structures with spaces therebetween having a profile which narrows towards a top of the shaped structures directly on the permanent antireflective coating;

filling the spaces between the shaped photoresist structures of the pattern with an interlevel dielectric composition without substantially altering a shape and size of the shaped photoresist structures, and the interlevel dielectric composition includes a material that becomes a permanent interlevel dielectric layer;

removing the shaped photoresist structures to provide shaped openings to form a reverse image pattern in the interlevel dielectric composition, the shaped openings having an inverse profile which narrows towards a top of the shaped openings; and filling the shaped openings with an electrically conductive fill material.

2. The method as recited in claim 1, further comprising forming a dielectric cap between the substrate and the photoresist wherein the dielectric cap is opened prior to the filling step.

3. The method as recited in claim 1, wherein the interlevel dielectric composition includes at least one of a polymer, a copolymer, a blend including at least two of any combination of polymers and/or copolymers, wherein the polymers include one monomer and the copolymers include at least two monomers and wherein the monomers of the polymers and the monomers of the copolymers are selected from: a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

4. The method as recited in claim 3, further comprising curing the interlevel dielectric composition thereby converting the interlevel dielectric composition into a patterned permanent interlevel dielectric layer.

5. The method as recited in claim 4, wherein said curing the interlevel dielectric composition to convert the interlevel dielectric composition into a patterned permanent interlevel dielectric layer comprises a thermal cure, an electron beam cure, an UV cure, an ion beam cure, a plasma cure, a microwave cure or any combination thereof.

6. The method as recited in claim 1, further comprises forming at least one air gap in the permanent interlevel dielectric layer between interconnect structures formed in the vias and trenches.

7. The method as recited in claim 1, wherein the electrically conductive fill material forms shaped interconnect structures having tapered sidewalls with an inverse profile which narrows towards a top of the shaped conductive structures.

8. The method as recited in claim 1, further comprising removing excessive interlevel dielectric composition fill to expose a top surface of the shaped photoresist structures by one of a wet removal, a reactive ion etch or a combination of both.

9. A method for fabricating an interconnect structure comprising:

forming first shaped photoresist structures in a first photoresist over a substrate wherein the first shaped photoresist structures include a profile which narrows towards a top of the shaped photoresist structures;

filling spaces between the first shaped photoresist structures with a first interlevel dielectric composition wherein the filling does not substantially alter a shape and size of the first shaped photoresist structures and the first interlevel dielectric composition includes a material to become a first permanent interlevel dielectric layer;

removing the first shaped photoresist structures to provide a reverse image pattern forming first shaped openings in the first interlevel dielectric composition, the first shaped openings including an inverse profile which narrows towards a top of the first shaped openings;

forming second photoresist structures in a second photoresist on top of the first permanent interlevel dielectric layer;

filling spaces between the second photoresist structures with a second interlevel dielectric composition wherein the filling does not substantially alter a shape and size of the second photoresist structures and the second interlevel dielectric composition includes a material to become a permanent interlevel dielectric layer;

removing the second photoresist structures to form second shaped openings to provide a reverse image pattern for forming interconnect structures; and filling the reverse image pattern of the permanent first and second interlevel dielectric layers with an electrically conductive fill material to form nterconnect structures.

10. The method as recited in claim 9, further comprising forming the first photoresist on the substrate and forming a permanent antireflective coating between the substrate and the first photoresist wherein the antireflective coating is opened prior to the filling step.

11. The method as recited in claim 9, further comprising forming the first photoresist on the substrate and forming a dielectric cap between the substrate and the first photoresist wherein the dielectric cap is opened prior to the filling step.

12. The method as recited in claim 9, wherein at least one of the first and second interlevel dielectric compositions includes at least one of a polymer, a copolymer, a blend including at least two of any combination of polymers and/or copolymers, wherein the polymers include one monomer and the copolymers include at least two monomers and wherein the monomers of the polymers and the monomers of the copolymers are selected from: a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silscsquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

13. The method as recited in claim 12, further comprising curing the at least one of the first and second interlevel dielectric compositions to convert the interlevel dielectric composition into a permanent interlevel dielectric layer.

14. The method as recited in claim 13, wherein the curing comprises at least one of a thermal cure, an electron beam cure, an ultraviolet (UV) cure, an ion beam cure, a plasma cure, a microwave cure or a combination thereof.

15. The method as recited in claim 9, further comprising removing excess interlevel dielectric composition to expose a top surface of at least one of the first shaped photoresist structures and/or the second photoresist structures.

16. The method as recited in claim 15, wherein removing excessive interlevel dielectric composition includes one of a wet removal, a reactive ion etch or a combination of both.

17. The method as recited in claim 9, wherein the conductive fill material forms interconnect structures and the method further comprises forming air gaps in at least one of the first permanent interlevel dielectric layer and the second permanent interlevel dielectric layer between the interconnect structures.

18. The method as recited in claim 9, wherein the conductive fill material forms interconnect structures having tapered sidewalls with an inverse profile.

\* \* \* \* \*